US009244290B2

(12) United States Patent
Vander et al.

(10) Patent No.: US 9,244,290 B2
(45) Date of Patent: Jan. 26, 2016

(54) METHOD AND SYSTEM FOR COHERENCE REDUCTION

(75) Inventors: Roman Vander, Gedera (IL); Shmuel Mangan, Rehovot (IL); Boris Goldberg, Ashdod (IL); Amir Moshe Sagiv, Beit-Zayat (IL)

(73) Assignee: Applied Materials Israel Ltd., Rehovot (IL)

( * ) Notice: Subject to any disclaimer, the term of this patent is extended or adjusted under 35 U.S.C. 154(b) by 178 days.

(21) Appl. No.: 13/978,102

(22) PCT Filed: Jan. 6, 2011

(86) PCT No.: PCT/US2011/020424
§ 371 (c)(1),
(2), (4) Date: Oct. 4, 2013

(87) PCT Pub. No.: WO2012/094011
PCT Pub. Date: Jul. 12, 2012

(65) Prior Publication Data
US 2014/0036942 A1 Feb. 6, 2014

(51) Int. Cl.
*G02B 26/00* (2006.01)
*G02B 27/48* (2006.01)
(Continued)

(52) U.S. Cl.
CPC ................ *G02B 27/48* (2013.01); *G03F 1/84* (2013.01); *G03F 7/20* (2013.01)

(58) Field of Classification Search
CPC ........ G02B 7/48; G02B 7/4222; G02B 27/48; G02B 27/4222; G02B 27/1006; G02B 26/001; G03F 7/20; G03F 9/00
USPC ...................................... 355/52, 53; 359/237
See application file for complete search history.

(56) References Cited

U.S. PATENT DOCUMENTS

| 4,660,980 A | 4/1987 | Takabayashi et al. |
| 2004/0099815 A1 | 5/2004 | Sfez et al. |

(Continued)

FOREIGN PATENT DOCUMENTS

| JP | 2006-501470 A | 1/2006 |
| JP | 2007147926 A2 | 6/2007 |

(Continued)

OTHER PUBLICATIONS

International Search Report and Written Opinion of the International Searching Authority for Application No. PCT/US2011/020424, mailed on Mar. 11, 2011, 1 page.

(Continued)

*Primary Examiner* — Darryl J Collins
*Assistant Examiner* — Journey Sumlar
(74) *Attorney, Agent, or Firm* — Kilpatrick Townsend & Stockton LLP

(57) ABSTRACT

An optical system having coherence reduction capabilities includes a light source for generating a first light pulse; an asymmetrical pulse stretcher arranged to receive the first light pulse and to generate multiple light pulses, during a pulse sequence generation period, wherein the asymmetrical pulse stretcher includes multiple optical components which define a loop and a condenser lens is located between the asymmetrical pulse stretcher and an object, for directing the multiple pulses toward an area on the object At least two optical components of the multiple optical components are positioned in an almost symmetrical manner in relation to each other and introduce a coherence-related difference between at least two pulses of the multiple pulses. The pulse sequence generation period does not exceed a response period of a detector.

20 Claims, 12 Drawing Sheets

(51) Int. Cl.
*G03F 7/20* (2006.01)
*G03F 1/84* (2012.01)

(56) References Cited

U.S. PATENT DOCUMENTS

| | | |
|---|---|---|
| 2005/0112474 A1 | 5/2005 | Sandstrom |
| 2006/0012802 A1 | 1/2006 | Shirley et al. |
| 2007/0121107 A1 | 5/2007 | Tsai et al. |
| 2007/0153393 A1 | 7/2007 | Chuang et al. |
| 2008/0212034 A1* | 9/2008 | Aksyuk et al. ............ 353/20 |
| 2009/0121157 A1 | 5/2009 | Moffatt et al. |
| 2009/0201494 A1 | 8/2009 | Furman et al. |
| 2009/0296758 A1 | 12/2009 | Brown et al. |
| 2010/0097680 A1 | 4/2010 | Naftali et al. |
| 2010/0163757 A1 | 7/2010 | Joobeur et al. |
| 2010/0265466 A1 | 10/2010 | Lescure et al. |
| 2014/0299790 A1 | 10/2014 | Shoham et al. |

FOREIGN PATENT DOCUMENTS

| | | | |
|---|---|---|---|
| JP | 2008277617 A2 | 11/2008 | |
| TW | 200821648 A | 5/2008 | |
| TW | M372948 U | 1/2010 | |
| WO | 2012/094011 A1 | 7/2012 | |
| WO | 2012/138344 A1 | 10/2012 | |

OTHER PUBLICATIONS

International Search Report of the International Searching Authority for International Application No. PCT/US2011/031629 mailed Jun. 27, 2011, 2 pages.

International Preliminary Report on Patentability for International Application No. PCT/US2011/031629 mailed Oct. 17, 2013, 7 pages.

International Preliminary Report on Patentability for International Application No. PCT/US2011/020424 mailed Jul. 18, 2013, 8 pages.

Non-Final Office Action of Oct. 6, 2014 for U.S. Appl. No. 14/009,869, 17 pages.

Notice of Allowance of Jan. 22, 2015 for U.S. Appl. No. 14/009,869, 14 pages.

* cited by examiner

METHOD AND SYSTEM FOR COHERENCE REDUCTION

CROSS-REFERENCE TO RELATED APPLICATIONS

This application is a National Stage of International Application No. PCT/US2011/020424, filed Jan. 6, 2011, the disclosure of which is incorporated herein by reference in its entirety for all purposes.

FIELD OF THE INVENTION

The present invention relates to inspection of objects, and in particular, to inspection of objects related to the manufacture of semiconductor devices. More specifically, the invention relates to the inspection of objects used in photolithography during the manufacture of semiconductor devices.

BACKGROUND

Current demands for high density and performance associated with ultra large scale integration in semiconductor devices require submicron features, increased transistor and circuit speeds, and improved reliability. Such demands require formation of device features with high precision and uniformity, which in turn necessitates careful process monitoring.

One important process requiring careful inspection is photolithography, wherein masks or "reticles" are used to transfer circuitry patterns to semiconductor wafers. Typically, the reticles are in the form of patterned chrome over a transparent substrate. A series of such reticles are employed to project the patterns onto the wafer in a preset sequence. Each photolithographic reticle includes an intricate set of geometric patterns corresponding to the circuit components to be integrated onto the wafer. The transfer of the reticle pattern onto the photoresist layer is performed conventionally by an optical exposure tool such as a scanner or a stepper, which directs light or other radiation through the reticle to expose the photoresist. The photoresist is thereafter developed to form a photoresist mask, and the underlying poly-silicon insulators or metal layer is selectively etched in accordance with the mask to form features such as lines or gates.

From the above description, it should be appreciated that any defect on the reticle, such as extra or missing chrome, may transfer onto the fabricated wafer in a repeated manner. Thus, any defect on the reticle would drastically reduce the yield of the fabrication line. Therefore, it is of utmost importance to inspect the reticles and detect any defects thereupon. The inspection is generally performed by an optical system, using transmitted, reflected, or both types of illuminations. An example of such a system is the Aera™ series reticle inspection system available from Applied Materials of Santa Clara, Calif.

There are several different known algorithm methods for inspection of reticles. These methods include: "Die to Die" inspection, in which a die is compared to a purportedly identical die on the same reticle; or "Die to Database" inspection, in which data pertaining to a given die is compared to information in a database, which could be the one from which the reticle was generated. Another inspection method involves Die to golden die which is a die chosen as a reference for inspecting wafers. There is also a design rule based inspection, in which the dye has to fulfill some line width and spacing requirements, and feature shapes should fit predefined shapes. Examples of these inspection methods, and relevant apparatus and circuitry for implementing these methods, are described in various U.S. patents, including, inter alia, U.S. Pat. Nos. 4,805,123; 4,926,489; 5,619,429; and 5,864,394. The disclosures of these patents are incorporated herein by reference.

Known inspection techniques typically use imaging the objects with a large magnification onto a charge-coupled device (CCD) camera. The imaging technique requires the object to be illuminated. The brightness of the illuminating source is a key factor in the ability to speed the inspection by reducing the integration time of the camera. As the patterns on wafers get smaller, it becomes necessary to use smaller wavelengths in order to be able to detect the patterns. This is due to the fact that the physical resolution limit depends linearly on the illumination wavelength and due to interference effects which require that the inspection be done at a wavelength similar to the one used in the lithographic process. As the wavelengths get smaller, conventional incoherent light sources like filament lamps or gas discharge lamps do not have enough brightness, and the light sources of choice become short wavelength lasers. The coherence of the laser, together with the roughness and aberrations of the surfaces as well as the patterned object along the light path, creates an artifact known as speckle, which is a noisy pattern over the image of the object.

Speckle causes problems in detection of the surfaces of objects being inspected and causes false alarms because of the non uniformity of the light pattern hitting the detector. Detection accuracy is degraded. Also, images taken of inspected objects are degraded. The problem is an acute one in this type of object inspection, because the power provided by coherent light is essential, among other reasons, as a result of losses stemming from the detection process.

When inspecting objects such as wafers or reticles, the speckle phenomenon can arise, if the spot size used for illumination is not much smaller than an element of a pattern on the wafer. However, in some circumstances, such as oblique illumination (in which the coherent light source is directed to the wafer at an angle), the spot size will be sufficiently large to cause speckle. Reducing the spot size will reduce system throughput and will require working at a wavelength that is smaller and different from the one used for imaging the object for example during the lithographic process. Consequently, as can be appreciated, there is a tradeoff between enduring speckle and optimizing detection sensitivity/throughput. Therefore, it would be desirable to solve the speckle problem, and thus enable the use of an increased spot size, and thus improve throughput.

SUMMARY

According to various embodiments of the invention a system and method are provided.

The method may be applied for coherence reduction and may include receiving, by an asymmetrical pulse stretcher, a first light pulse; wherein the asymmetrical pulse stretcher comprises multiple optical components which define a loop; wherein at least two optical components of the multiple optical components are positioned in an almost symmetrical manner in relation to each other; generating a sequence of multiple pulses, by the pulse stretcher, during a pulse sequence generation period and in response to the first light pulse; wherein the at least two optical components introduce a coherence-related difference between at least two pulses of the multiple pulses; wherein the pulse sequence generation period does not exceed a response period of a detector; illuminating an area of an object by the multiple pulses; and detecting light from the area by the detector.

The method may include directing the multiple pulses towards substantially the same area of the object.

The coherence-related difference may be a difference between an incidence angle of the at least two pulses.

The coherence-related difference may be a difference between a location of incidence of the at least two pulses.

The method may include introducing an angular difference between two pulses of the multiple pulses and introducing a location of incidence difference between two pulses of the multiple pulses.

The method may include directing the multiple pulses towards a second speckle reduction component; wherein the second speckle reduction component reduces a coherency of the multiple pulses.

The method may include outputting, by the asymmetrical pulse stretcher, the multiple pulses from an output that may be positioned at a pupil plane of a condenser lens that directs the pulses towards the object.

The method may include receiving the first light pulse from a laser, wherein a duration of the first light pulse does not exceed few nanoseconds.

The multiple optical components may include multiple mirrors, wherein an orientation angle of one mirror differs from (a) an orientation of another mirror, and (b) an orientation that is differs an opposite orientation of the orientation of the other mirror.

The multiple optical components may include multiple mirrors wherein at least one mirror may be located at a height that differs from height of all other mirrors.

An optical system may be provided. The optical system may have coherence reduction capabilities, and may include a light source for generating a first light pulse; an asymmetrical pulse stretcher arranged to receive the first light pulse and to generate multiple light pulses, during a pulse sequence generation period, wherein the asymmetrical pulse stretcher comprises multiple optical components which define a loop; wherein at least two optical components of the multiple optical components are positioned in an almost symmetrical manner in relation to each other; wherein the at least two optical components introduce a coherence-related difference between at least two pulses of the multiple pulses; wherein the pulse sequence generation period does not exceed a response period of a detector and a condenser lens located between the asymmetrical pulse stretcher and an object for directing the multiple pulses toward an area on the object.

The condenser lens may be arranged to direct the multiple pulses towards substantially the same area of the object.

The coherence-related difference may be a difference between an incidence angle of the at least two pulses.

The coherence-related difference may be a difference between a location of incidence of the at least two pulses.

The asymmetrical pulse stretcher may be arranged to introduce an angular difference between two pulses of the multiple pulses and introducing a location of incidence difference between two pulses of the multiple pulses.

The asymmetrical pulse stretcher may be arranged to direct the multiple pulses towards a second speckle reduction component; wherein the second speckle reduction component reduces a coherency of the multiple pulses.

The asymmetrical pulse stretcher may be arranged to output the multiple pulses from an output that may be positioned at a pupil plane of a condenser lens that directs the pulses towards the object.

The light source may be a laser, wherein a duration of the first light pulse does not exceed few nanoseconds.

The multiple optical components may include multiple mirrors, wherein an orientation angle of one mirror differs from (a) an orientation of another mirror, and (b) an orientation that is differs an opposite orientation of the orientation of the other mirror.

The multiple optical components may include multiple mirrors wherein at least one mirror may be located at a height that differs from height of all other mirrors.

BRIEF DESCRIPTION OF THE DRAWINGS

Further details, aspects, and embodiments of the invention will be described, by way of example only, with reference to the drawings.

DETAILED DESCRIPTION

Figure 1:
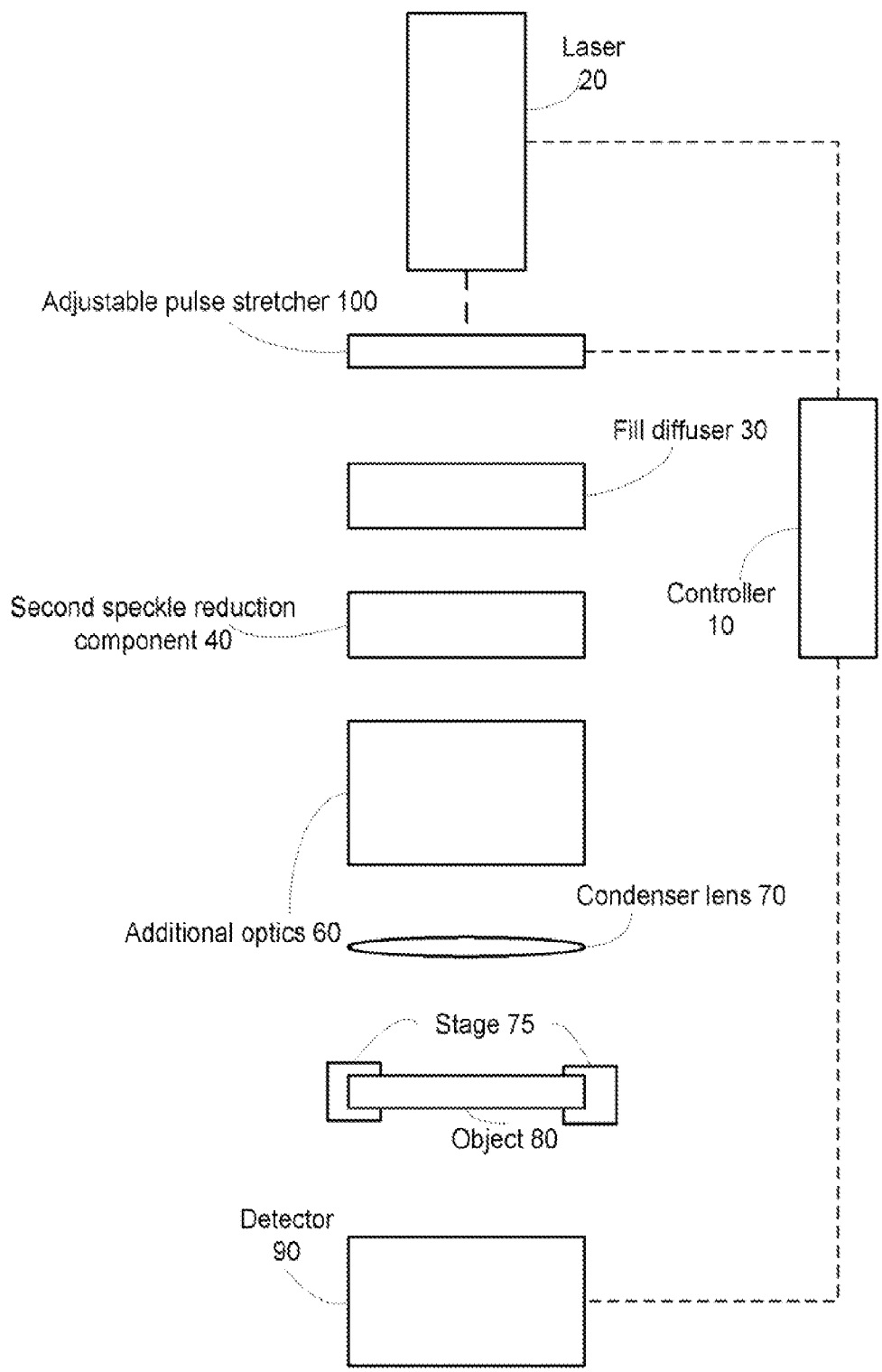
FIG. 1 schematically shows a system according to an embodiment of the invention.

In the following specification, the invention will be described with reference to specific examples of embodiments of the invention. It will, however, be evident that various modifications and changes may be made therein without departing from the broader spirit and scope of the invention as set forth in the appended claims.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In view of the foregoing, one feature of the invention is the provision of an optical system for reducing speckle during inspection of objects used in the manufacture of semiconductor devices. Another feature of the present invention resides in the provision of an optical system for reducing speckle in inspection systems operating at low wavelengths, particularly in the deep UV region.

A further feature of the present invention is the reduction of speckle in inspection systems using pulsed laser beams, particularly using pulses in the 5-50 ns region.

To provide the foregoing and other features, to overcome the limitations in the prior art described above, and to solve various problems that will become apparent upon reading and understanding of the following detailed description, the present invention provides a method and apparatus for reducing speckle during the inspection of objects used in the fabrication of semiconductor devices, especially wafers, masks, photomasks, and reticles.

In accordance with the present invention a light pulse is converted, by an asymmetrical pulse stretcher to multiple pulses during a period that is referred to as a pulse sequence generation period. The pulse sequence generation period is smaller than the response period of a detector thus the detector virtually integrates light reflected or scattered from the object due to these multiple pulses. The multiple pulses differ from each other by a coherence-related difference such as their angle of incidence difference, their location of incidence difference or both. Alternatively, at least two pulses out of the multiple pulses differ from each other by a coherence-related difference. The generation of the multiple pulses involves providing a first light pulse to the asymmetrical pulse stretcher that generates multiple light pulses that may differ from each other by one or more characteristics such as an angle of incidence, a location of the pulse that is outputted from the asymmetrical pulse stretcher or both. If the output of the asymmetrical pulse stretcher is located in a pupil plane of a condenser lens that condenses the pulses onto the object than changes in the angles of the outputted pulses are translated to spatial differences and changes in the location of the outputted pulses are translated to changes in the angle of incidence of the pulses.

The asymmetrical pulse stretcher can have an optical elements such as a lens, a mirror, a beam splitter, a grid, and the like that are arranged in an asymmetrical manner.

The multiple pulses are directed towards substantially the same area of the object. Light from this area is detected by a detector such as but not limited to an imaging detector. The response period of the detector can be its integration period.

Figure 2:
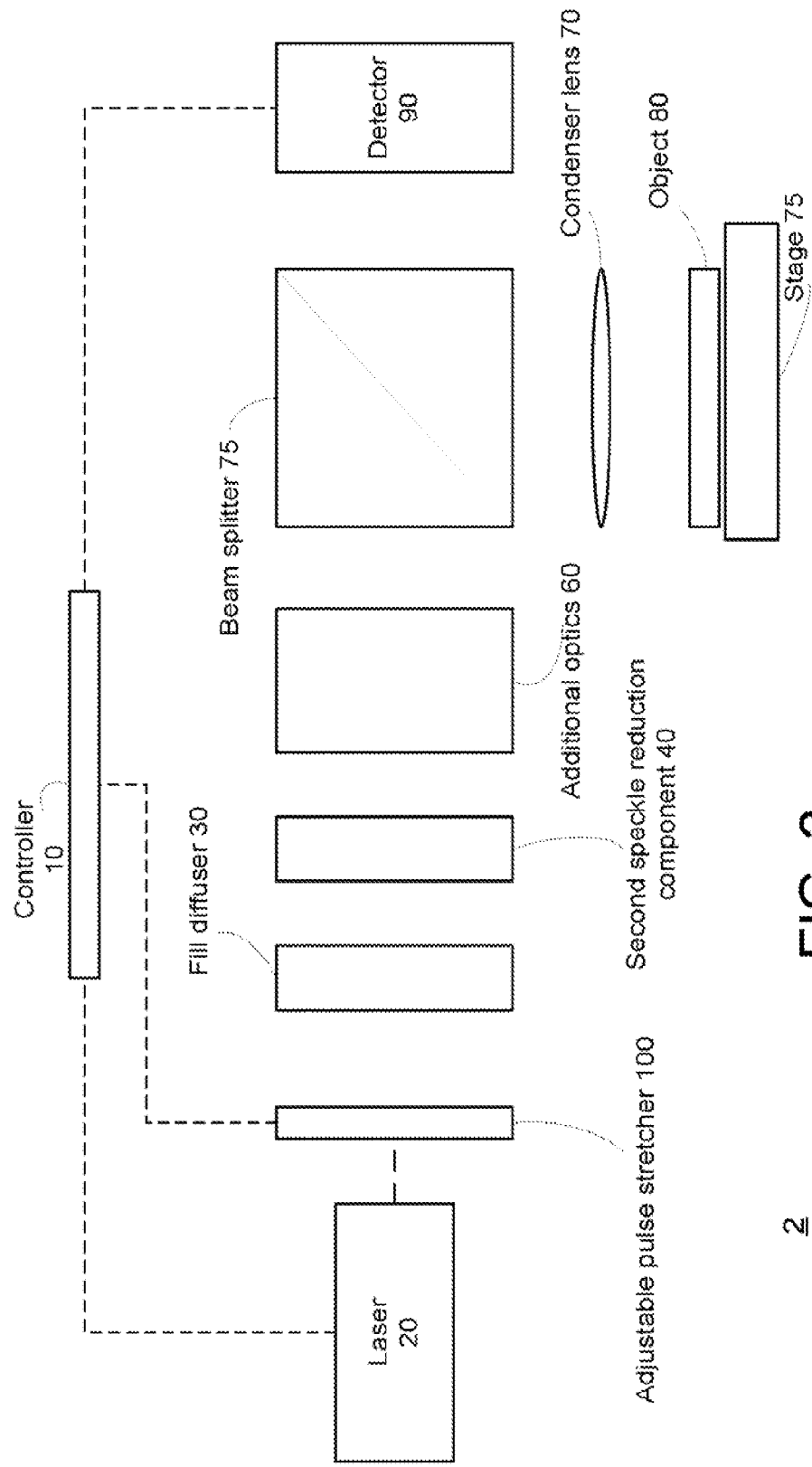
FIG. 2 schematically shows a system according to an embodiment of the invention.

FIG. 1 shows an exemplary system 1 for use in accordance with the present invention. The system device shown in FIG. 1 is operating in a transmissive mode while the system of FIG. 2 is operating in a reflective mode. However, it is to be understood that systems operating in both a transmissive and a reflective mode, are within the contemplation of the invention. At least for the transmissive mode of operation, a beam homogenizer should be employed prior to the beam's entering a coherence reduction/speckle reduction apparatus.

It is further noted that both figures illustrated substantially normal illumination of the object but this is not necessarily so. Thus, a variety of oblique illumination angles can be used, that give rise to bright field reflection distribution (normal), dark field reflection distribution (lower side) and Gray Field™ reflection distribution (between the normal and lower side) can be used.

In FIG. 1, an object 80 to be inspected, such as a wafer, a mask, a photomask, or a reticle, is positioned on an x-y stage 75, which moves the object 80 in two directions in a plan defined by the inspected face of object 80. According to an embodiment of the invention, system 1 includes a pulsating light source such as laser 20, located on one side of the object 80. Laser 20 can generate coherent pulses, almost coherent pulses or pulses that have a low coherence level. The coherence of the pulses is further reduced by asymmetrical pulse stretcher 100 and optionally by second speckle reduction component 40 or other elements (not shown) of system 1. The pulses can be low wavelength laser pulses in the UV or deep UV region. The pulses emitted by laser 20 are directed via asymmetrical pulse stretcher 100 that generates multiple pulses. The multiple pulses propagate through fill diffuser 30, second speckle reduction component 40, additional optics 60, condenser lens 70, object 80 and finally reach detector 90.

It should be noted that other means of directing the beams onto the object 80, including other optical paths defined by suitable structure, also may be used.

Light that passes through object 80 are detected by detector 90. Detector 90 can be a time delay integration (TDI) sensor or a CCD sensor, which could be a line sensor, or a two dimensional sensor Detector 90 enables imaging of the object 80, while allowing the stage 75 carrying the object 80 to move continuously relative to the laser 20.

Additional optics 60 can include diffusers, auto focus optics, homogenizers, relay lenses and the like.

Various components of system 1 can be controlled by controller 10. It is noted that both distributed and centralized control schemes can be applied. Controller 10 can determine when to generate a light pulse and when and how to change a characteristic of the asymmetrical pulse stretcher 100.

The asymmetrical pulse stretcher 100 outputs pulses through an output region that is smaller than the input region of another component such as the second speckle reduction component 40. In order to compensate for these differences a fill diffuser 30 is placed after asymmetrical pulse stretcher 100.

The light that arrives to detector 90 contains information about an area and especially about one or more patterns within an illuminated area of object 80 and of any defects present in the object 80 and on its surface.

The coherent nature of the laser 20, and its wavelength of operation in comparison with the size of possible defects, can produce speckle at the detector 90. Speckle causes unpredicted signal non uniformities, thus making it harder to distinguish the defects, and may allow some microscopic defects to remain undetected. Therefore, there is a need to reduce the speckle phenomenon by breaking the coherence of the light beam. The coherence reduction is performed by asymmetrical pulse stretcher 100 and second speckle reduction component 40.

Second speckle reduction component 40 can apply prior art speckle reduction techniques. It can include one or more stairs of glass, can include one or more fiber bundles, and the like. Various speckle reduction elements and methods are illustrated in U.S. Pat. No. 7,463,352 titled "Method and apparatus for object inspection including speckle reduction"; U.S. Pat. No. 7,133,548 titled "Method and apparatus for reticle inspection using aerial imaging", U.S. Pat. No. 6,924,891 titled "Method and apparatus for object inspection including speckle reduction" and U.S. Pat. No. 6,798,505 titled "Method and apparatus for object inspection including speckle reduction", U.S. Pat. No. 4,619,508 titled "Illumination optical arrangement, U.S. Pat. No. 4,521,075 titled "Controllable spatial incoherence echelon for laser", all being incorporated herein by reference.

FIG. 2 illustrates system 2 according to an embodiment of the invention. System 2 operates in a reflected mode. With reference to system 1 illustrated in FIG. 1, same elements are marked with same numbers. System 2 further includes a beam splitter 65 that (a) directs light pulses toward condenser lens 70 and object 80 and (b) directs light from object 80 and condenser lens 70 towards detector 90.

Figure 3:
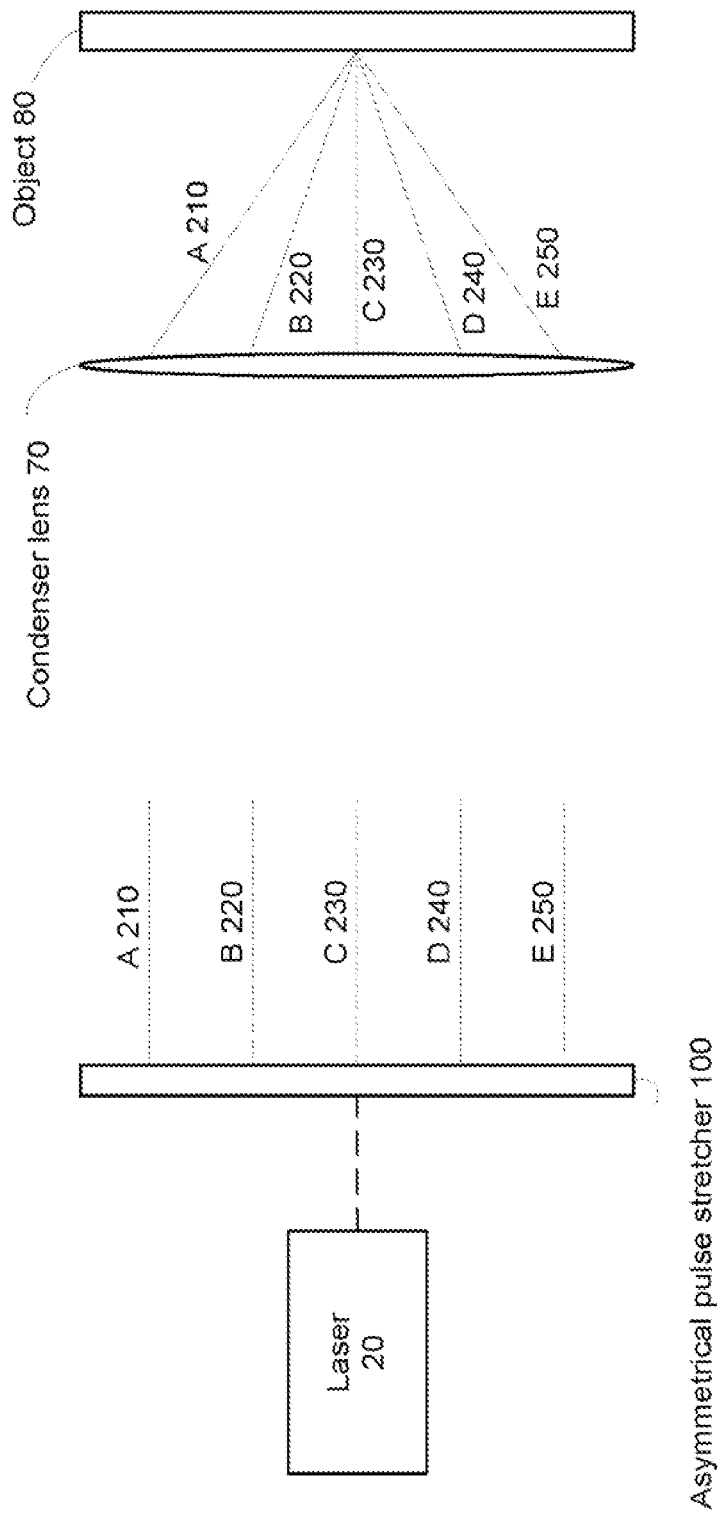
FIG. 3 illustrates a laser, an asymmetrical pulse stretcher, a condenser lens and an object as well as the paths of various pulses according to an embodiment of the invention.

FIG. 3 illustrates laser 20, asymmetrical pulse stretcher 100, condenser lens 70 and object 80 as well as the paths (illustrated by dashed lines) of various pulses according to an embodiment of the invention. For simplicity of explanation the paths of these pulses are illustrated out of scale and multiple components of system 1 are not shown.

Pulses A 210, B 220, C 230, D 240 and E 250 are outputted at different points in time by asymmetrical pulse stretcher 100 in response to a single pulse from laser 20.

Asymmetrical pulse stretcher 100 introduces lateral displacements between these pulses and these lateral displacements are translated to angle of incidence changes in relation to object 80. Pulses A 210, B 220, C 230, D 240 and E 250 illuminate substantially the same spot onto object 80.

Figure 4:
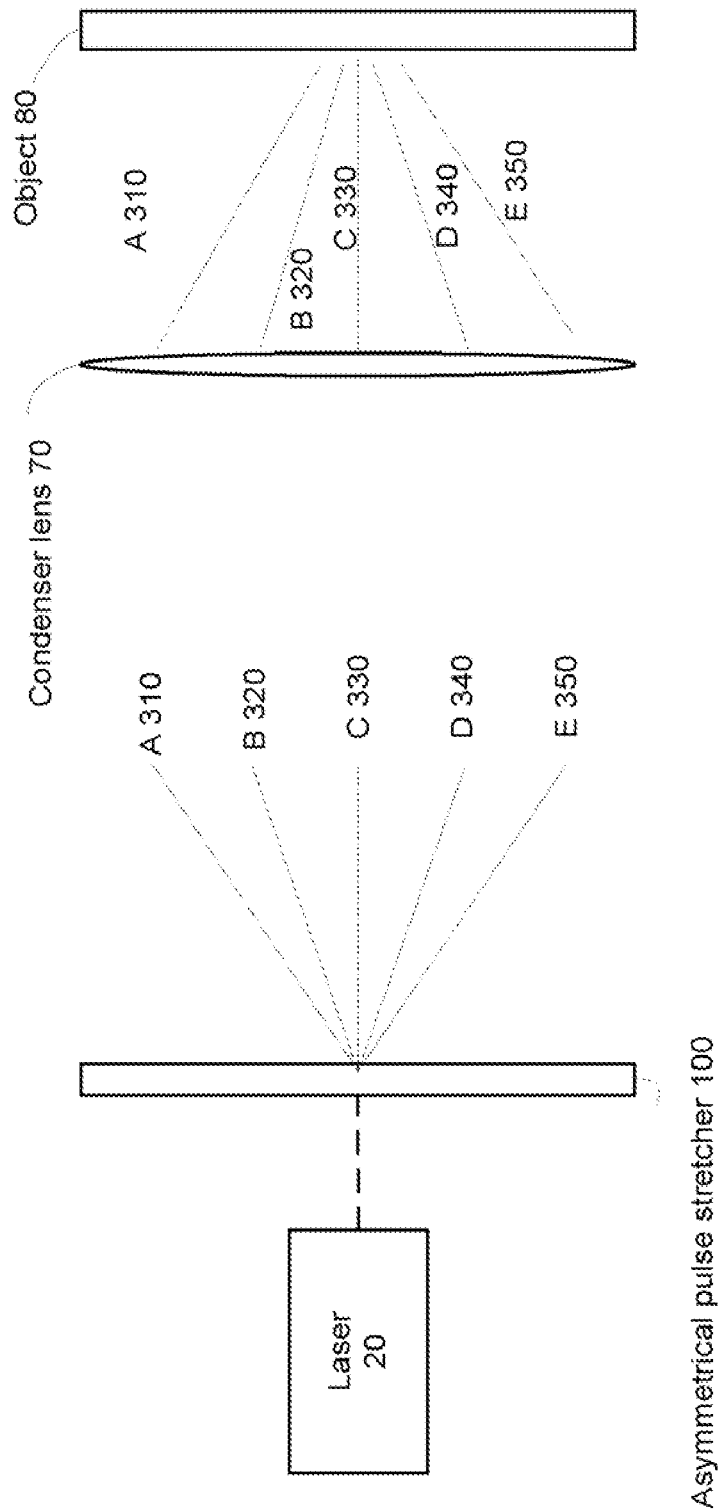
FIG. 4 illustrates a first light pulse and five pulses that are generated by an asymmetrical pulse stretcher according to an embodiment of the invention.

FIG. 4 illustrates laser 20, asymmetrical pulse stretcher 100, condenser lens 70 and object 80 as well as the paths (illustrated by dashed lines) of various pulses according to an embodiment of the invention. For simplicity of explanation the paths of these pulses are illustrated out of scale and multiple components of system 1 are not shown.

Pulses A 310, B 320, C 330, D 340 and E 350 are outputted at different points in time by asymmetrical pulse stretcher 100 in response to a single pulse from laser 20.

Asymmetrical pulse stretcher 100 introduces angular differences between these pulses and these angular differences are translated to location differences in relation to object 80. Thus, pulses A 310, B 320, C 330, D 340 and E 350 illuminate an area on the face of object 80.

Figure 5:
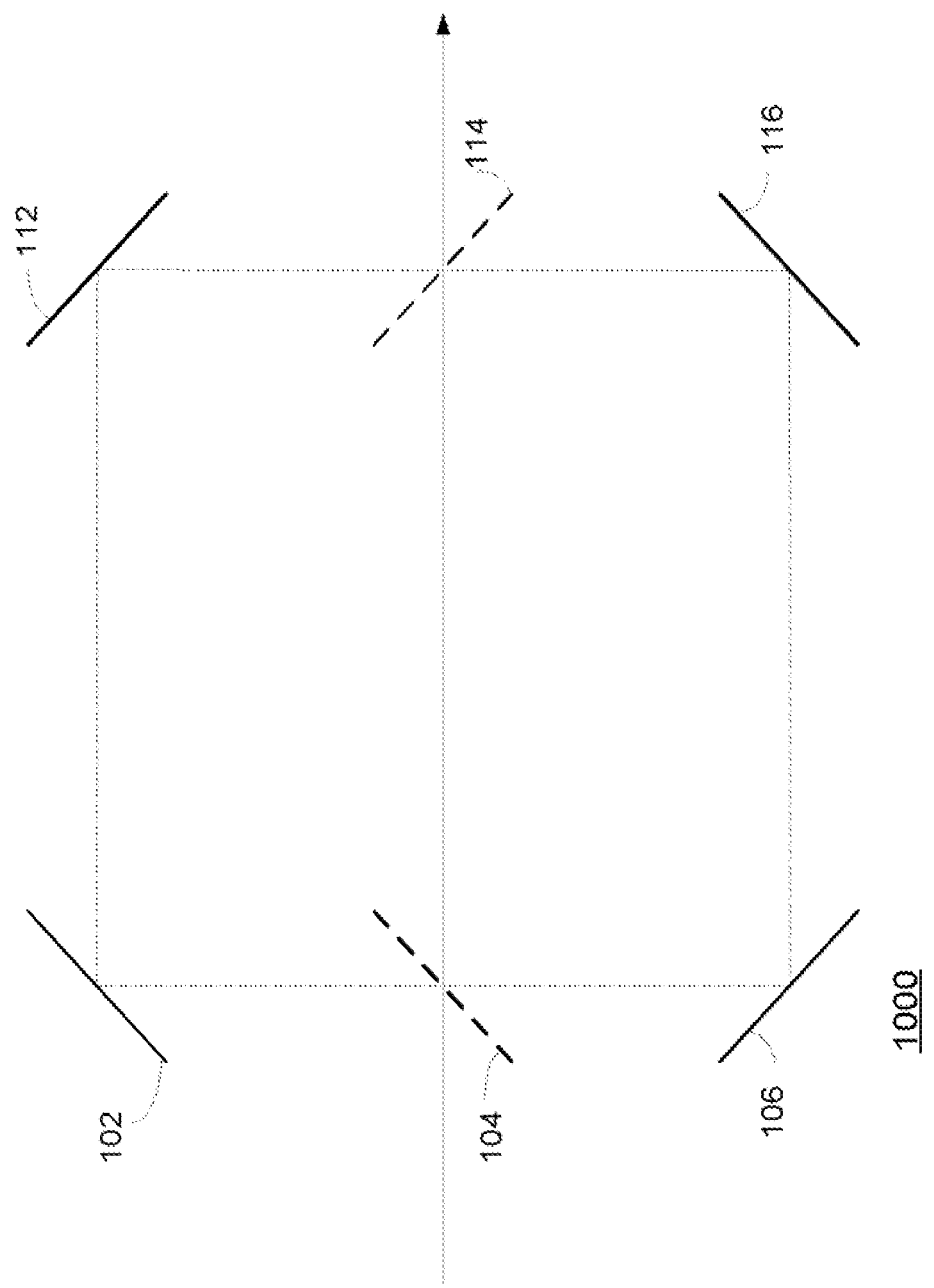
FIG. 5 illustrates an symmetrical pulse stretcher.

FIG. 5 illustrates a symmetrical pulse stretcher 1000.

The symmetrical pulse stretcher 1000 includes multiple optical components such as input beam splitter 104, output beam splitter 114 and four reflecting elements such as upper left mirror 102, upper right mirror 112, lower left mirror 106 and lower right 116.

These optical components are arranged in two columns. Input beam splitter 104 is located below upper left mirror 102 and above lower left mirror 106. Output beam splitter 114 is located below upper right mirror 112 and above lower right mirror 116.

These multiple optical components are arranged in a symmetrical manner about an imaginary vertical axis 111 such that: (a) The upper left mirror 102 is positioned and is oriented in a symmetrical manner to the upper right mirror 112, (b) the lower left mirror 106 is positioned and is oriented in a symmetrical manner to the lower right mirror 116, and (c) the output beam splitter 114 is positioned and is oriented in a symmetrical manner to the input beam splitter 104.

This symmetry provides that a light beam that enters a loop defines by these optical elements is converted to a sequence of light pulses that exit the symmetrical pulse stretcher 1000 at the same direction and position.

FIGS. 6-11 illustrate asymmetrical pulse stretchers 100 according to various embodiments of the invention.

In these asymmetrical pulse stretchers 100 at least one optical components deviates (by orientation, height, position or a combination thereof) from the symmetrical arrangement illustrated in FIG. 5. These deviations cause the outputted light beams to differ from each other by their location and, additionally or alternatively, by direction (angle) of propagation.

For example, one or more mirrors out of 102, 106, 112 and 116 can be located slightly outside of the symmetrical configuration illustrated in FIG. 5, or is positioned somewhat above that symmetrical position. The same applies to the beam splitters 104 and 114.

This asymmetry changes the path that light passes through during each iteration within the loop and the outputted beams differ from each other by their delay, gain and additionally or alternatively their direction.

For example, a slight misplacement of about 0.1μ in a location of an optical element may provide a difference of about 1μ between the outputted pulses.

At least some of these optical components can be rotated in relation to the symmetrical configuration or have its location changed in relation to the symmetrical configuration.

Figure 6:
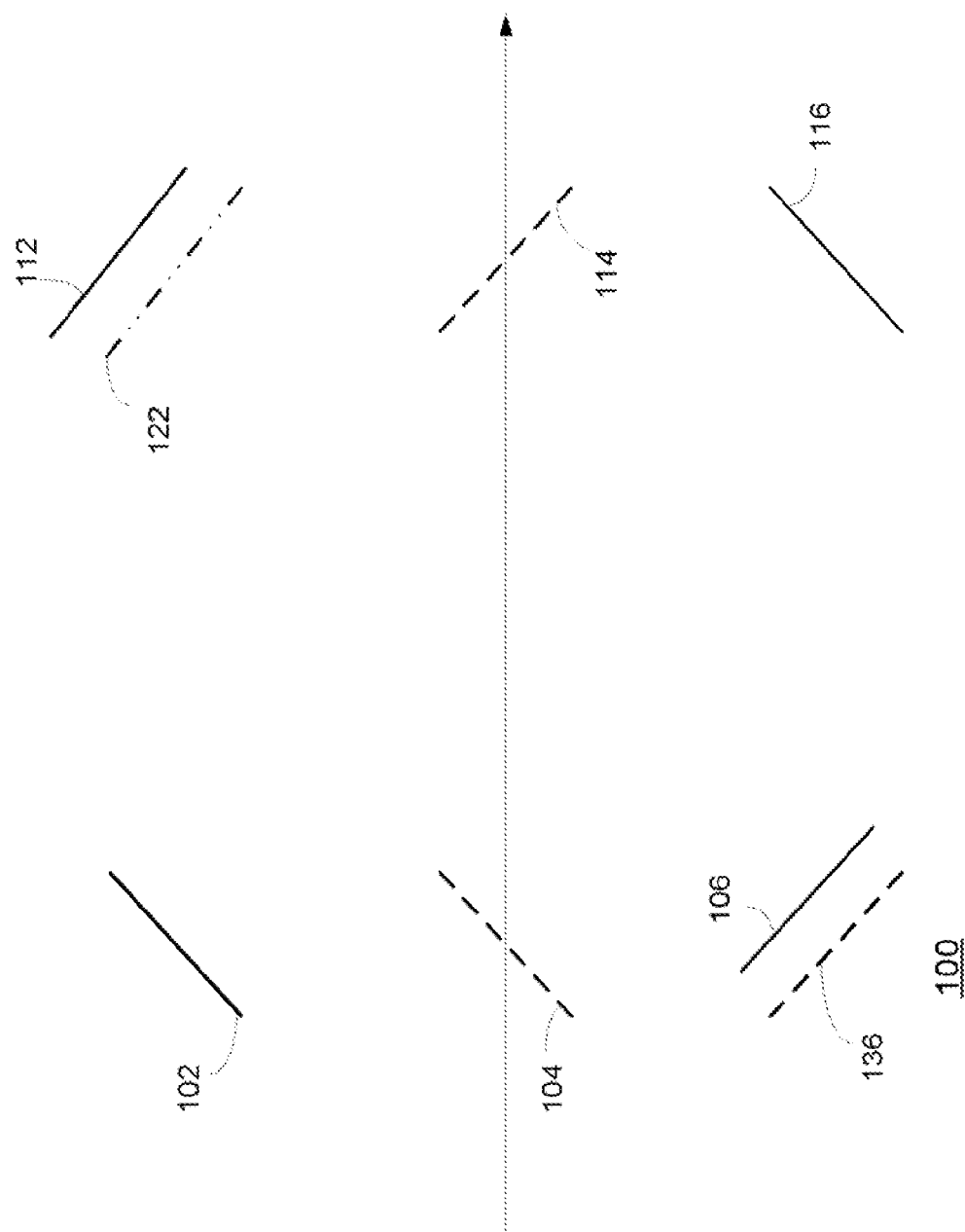
FIGS. 6-11 illustrate asymmetrical pulse stretchers according to various embodiments of the invention.

In FIG. 6 the upper right mirror 112 is elevated in relation to its symmetrical position (denoted by 121) and the lower left mirror 1062 is are elevated in relation to its symmetrical position (denoted by 126).

Figure 7:
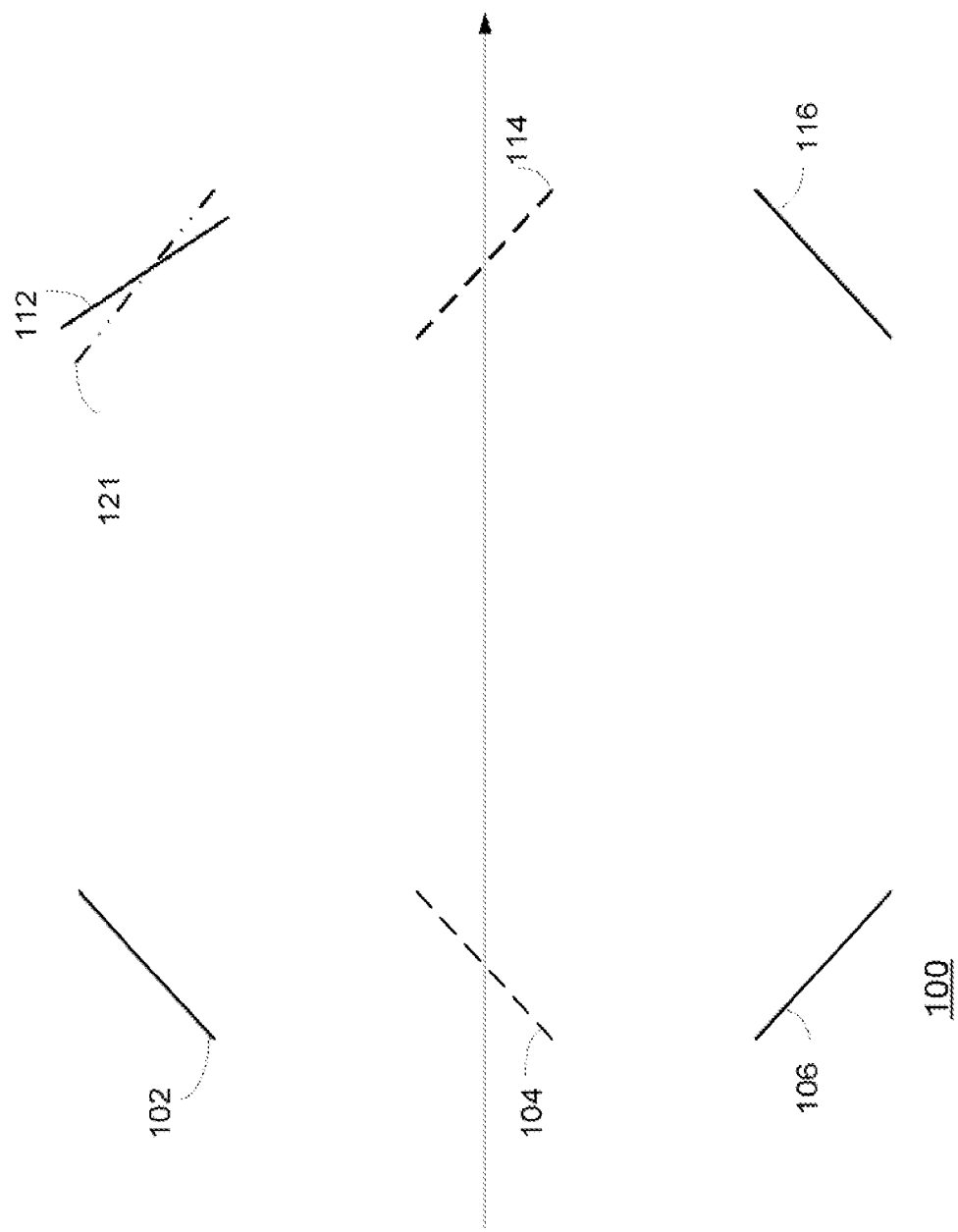

In FIG. 7 the upper right mirror 112 is tilted in relation to its symmetrical position (denoted by 121).

Figure 8:
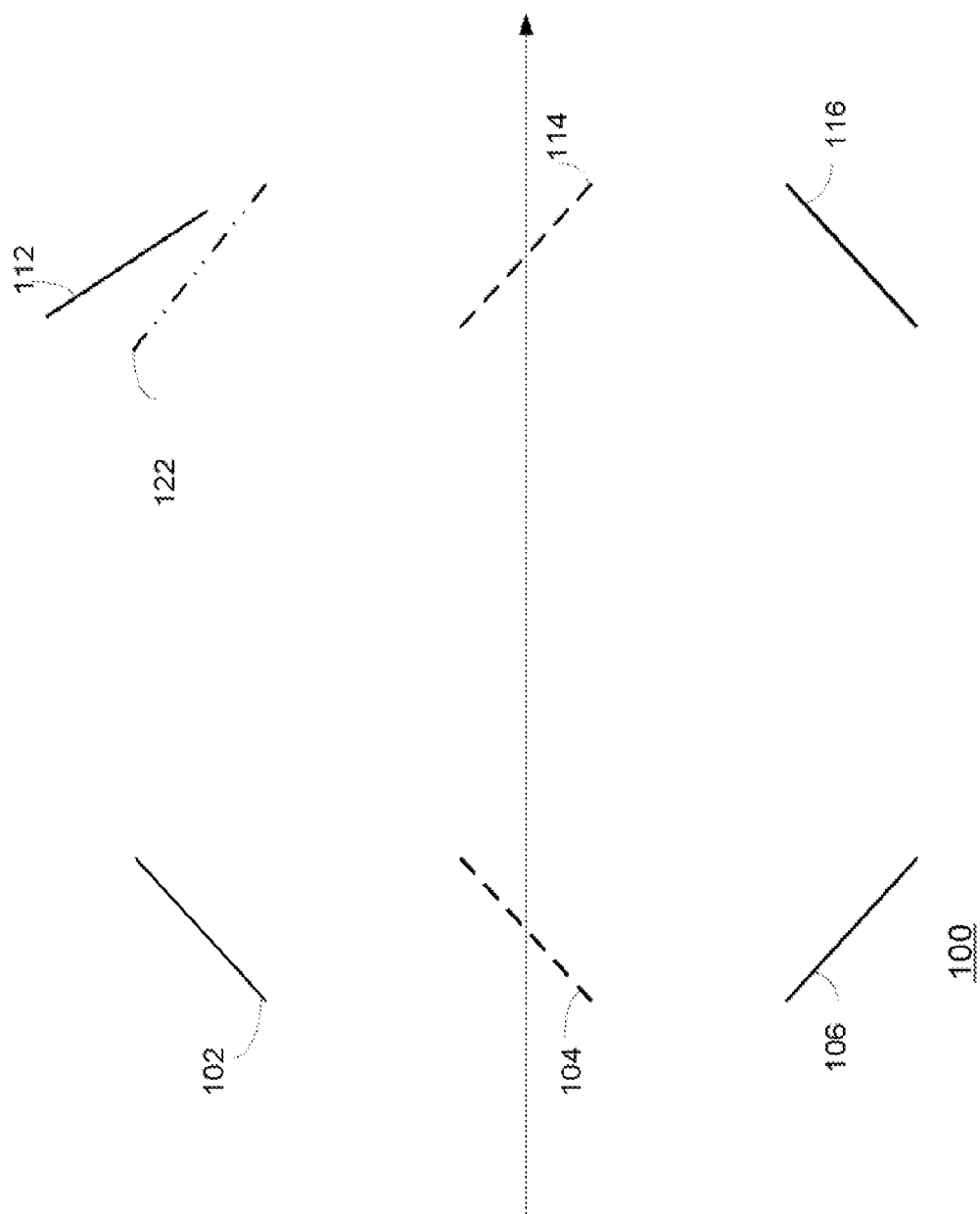

In FIG. 8 the upper right mirror 112 is both rotated and elevated in relation to its symmetrical position (denoted by 121).

Figure 9:
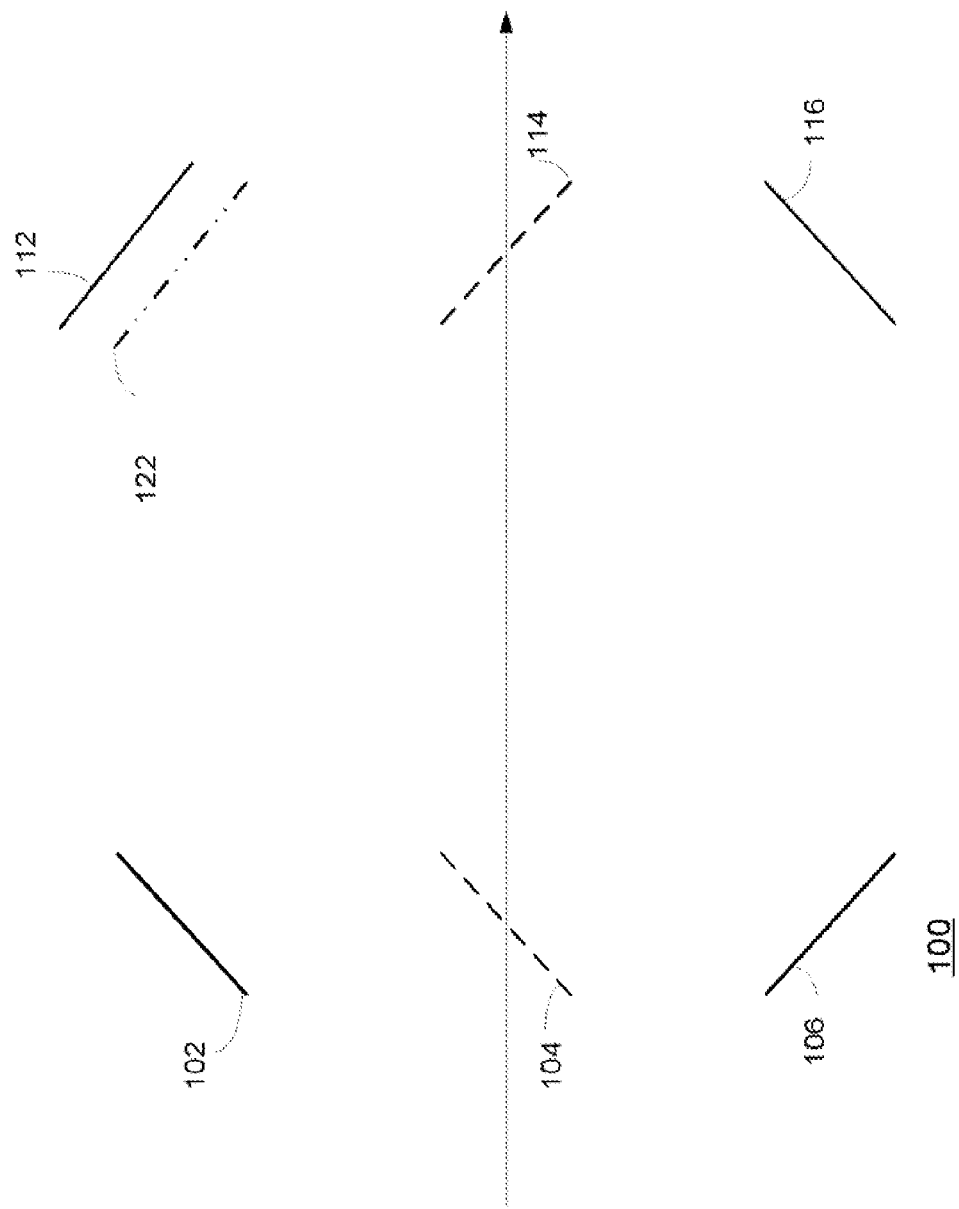

In FIG. 9 the upper right mirror 112 is elevated in relation to its symmetrical position (denoted by 121).

Figure 10:
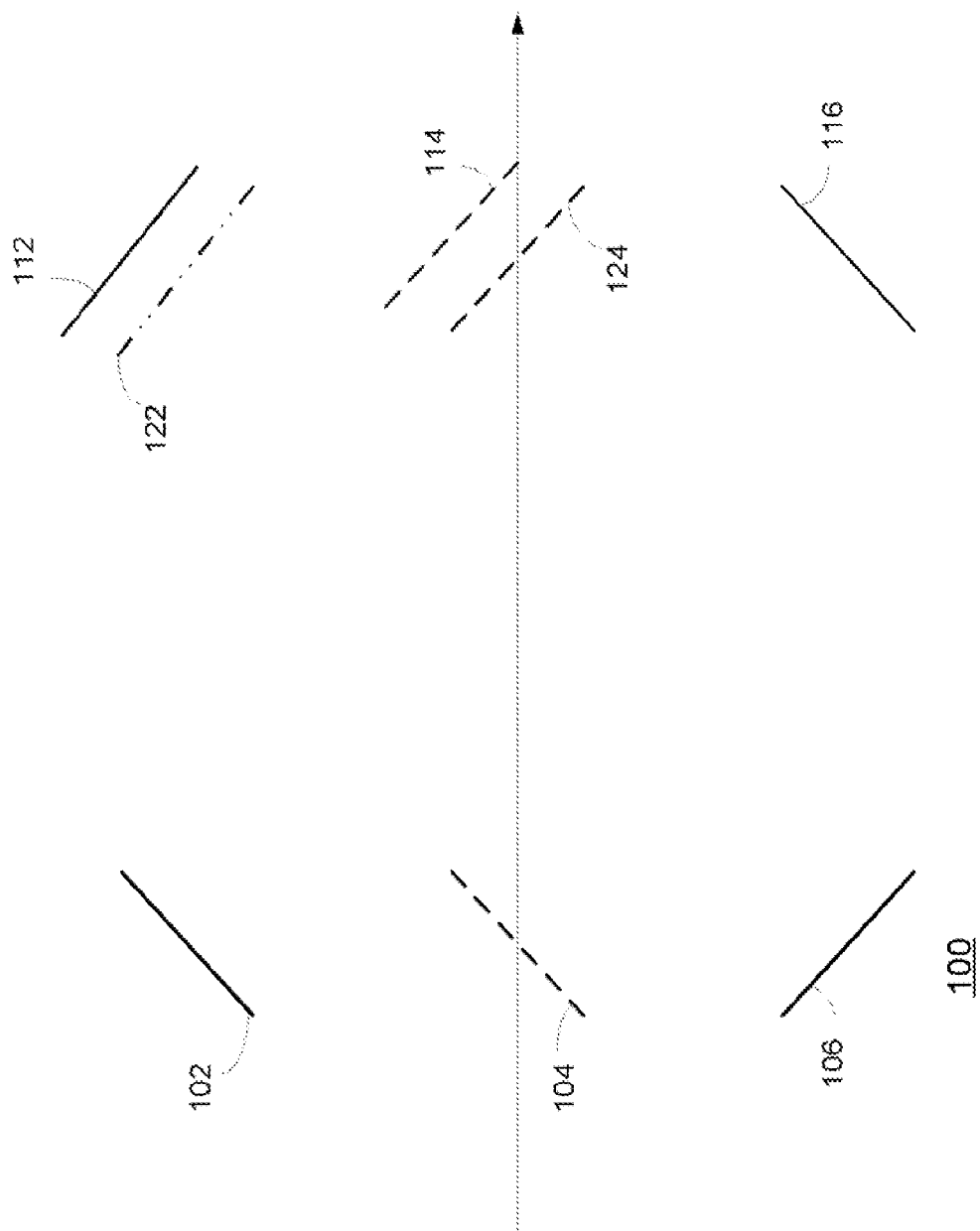

In FIG. 10 the upper right mirror 112 and the output beam splitter 114 are elevated in relation to their symmetrical position (denoted by 121 and 124 respectively).

Figure 11:
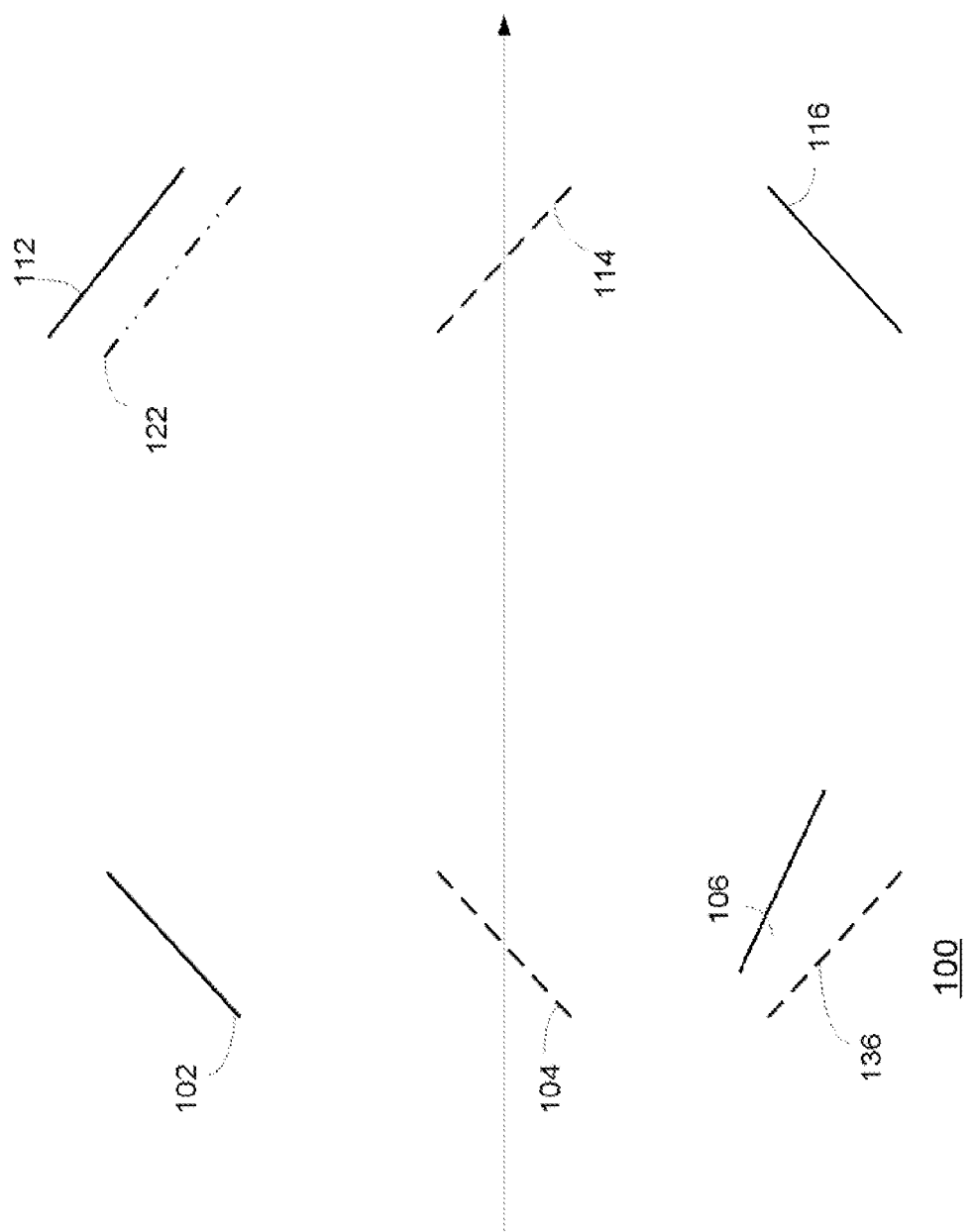

In FIG. 11 the upper right mirror 112 is elevated in relation to its symmetrical position (denoted by 121) and the lower left mirror 1062 is are elevated in relation to its symmetrical position (denoted by 126) and is rotated in relation to that symmetrical position.

It is noted that the deviation from symmetry can be applied to any of the optical components 102, 104, 106, 112, 114 and 116. It is noted that deviations from the symmetrical position may include shift to the left, shift to the right and a combination thereof.

Referring to the previous figures, a first input pulse A portion of pulse 400 (of FIG. 5) that is sent from laser 20 can propagate through beam splitters 104 and 114 to provide a first pulse. A portions of this pulse can be directed by input beam splitter 104 towards lower left mirror 106, right lower mirror 116 and output beam splitter 114 to provide another pulse. A portion of the pulse from right lower mirror 116 passes through output beam splitter 114 and propagates towards upper right mirror 112 to be reflected towards upper left mirror 102 and input beam splitter 104. A portion of this pulse is directed from input beam splitter 104 towards output beam splitter 114 and another portion passes through input beam splitter 104 and propagates towards lower left mirror 106. Thus, by changing a relative angle and/or a relative displacement of at least two optical components, e.g. the angle between mirror 112 and any other component 102, 104, 106, 114, 116; or the relative displacement of beam splitter 114 relative to any other component 102, 104, 106, 112, 116, multiple pulses are generated, having different angles of incidence and/or different locations of incidence with respect to a condenser lens located further downstream the illumination path. As the pulse sequence generation period is smaller than the response period of a detector, the detector virtually integrates light reflected or scattered from the object due to these multiple pulses.

It is noted that the asymmetrical pulse stretcher 100 can have other configurations.

According to one, non-limiting example, pulse stretcher 100 can be based, on the pulse stretcher illustrated in U.S. Pat. No. 7,084,959 titled "Compact pulse stretcher". This pulse stretcher includes a first prism and a second prism positioned opposite each other. A first coupling prism is optically coupled to the first prism with a partially reflective interface that directs a beam towards the second prism in a helical path. The first prism and the first coupling prism form a beam splitter. A re-circulating prism (or a reflective element) reflects the beam from the first prism into the second prism. Mirrors are positioned around the first and second prisms to permit recirculation of the beam through the first and second prisms. The beam re-circulates through the first and second prisms using two or more helical paths. The pulse stretcher described in U.S. Pat. No. 7,084,959 can be incorporated into a lithographic system with some modifications. This pulse stretcher can become an asymmetrical one by changing the spatial relationship between one or more of its prisms so as to alter the helical path through which light propagates.

According to another, non-limiting example, pulse stretcher 100 can be based, on the pulse stretcher illustrated in U.S. Pat. No. 7,321,605 titled "Helical optical pulse stretcher". This pulse stretcher includes a single pass pulse stretcher. An optical system is arranged around the single pass pulse stretcher. A beam enters the single pass stretcher and is reflected in a helical path using the optical system for multiple passes through the single pass pulse stretcher. The single pass pulse stretcher can include two 90 degree prisms, with a beam splitter located therebetween. The optical system can include first and second prisms. At least one of the first and second prisms can be a roof prism. The first and second prisms can have at least one surface oriented so as to direct the beam into the helical path. The optical system can have at least one mirror, or a plurality of mirrors. This pulse stretcher can become an asymmetrical one by changing the spatial relationship between one or more of its prisms, beam splitters and single pass stretcher.

Figure 12:
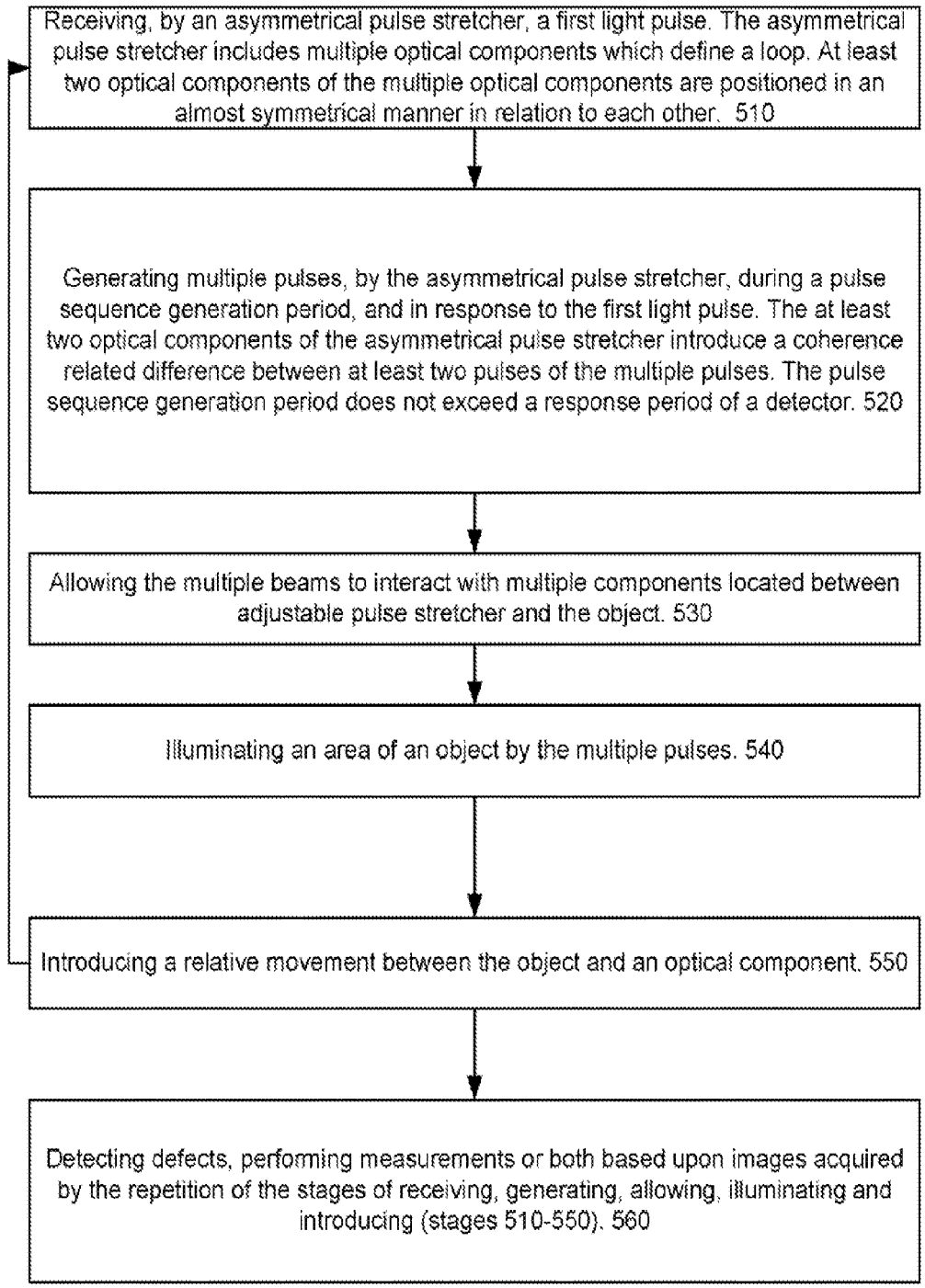
FIG. 12 illustrates a method according to an embodiment of the invention.

FIG. 12 illustrates method 500 according to an embodiment of the invention.

Method 500 can be executed by either one of systems 1 and 2.

Method 500 starts by stage 510 of receiving, by an asymmetrical pulse stretcher, a first light pulse. The asymmetrical pulse stretcher includes multiple optical components which define a loop. At least two optical components of the multiple optical components are positioned in an almost symmetrical manner in relation to each other.

The first light pulse can be generated by a laser and a duration of the first light pulse does not exceed few nanoseconds.

Stage 510 can be preceded by a stage (not shown) of generating the first light pulse by a light source such as a laser. The first light pulse can be coherent or almost coherent but this is not necessarily so.

Stage 510 is followed by stage 520 of generating multiple pulses, by the asymmetrical pulse stretcher, during a pulse sequence generation period, and in response to the first light pulse. The at least two optical components of the asymmetrical pulse stretcher introduce a coherence-related difference between at least two pulses of the multiple pulses. The pulse sequence generation period does not exceed a response period of a detector.

The coherence-related difference can be a difference between an incidence angle of the at least two pulses, a difference between a location of incidence of the at least two pulses or a combination thereof.

The asymmetrical pulse stretcher can output the multiple pulses from an output that is positioned at a pupil plane of a condenser lens that directs the pulses towards the object.

Accordingly, the multiple pulses can include a pair of pulses that differ from each other by their angle of incidence and yet another pair of pulses that differ by their location of incidence. Yet for another example the multiple pulses can include a pair of pulses that differ from each other by their angle of incidence as well as their location of incidence.

Stage 520 is followed by stage 530 of allowing the multiple beams to interact with multiple components located between asymmetrical pulse stretcher and the object.

Stage 530 can include, for example, passing the multiple beams through a fill diffuser, homogenizer, one or more lenses and a second speckle reduction component. In the latter case stage 530 can include reducing the coherency of the multiple pulses by the second speckle reduction component.

Stage 530 is followed by stage 540 of illuminating an area of an object by the multiple pulses.

Stage 540 can include detecting light from the area by the detector. The area can be very small and can be substantially equal to a size of about one spot formed by one of the light pulses on the object. The area can be equal to few spots, especially when a spatial displacement is introduced between the spots. The area can range between few square microns to few square millimeters.

Stages 510-540 can be repeated while a relative movement is introduced between the object and an optical component such as the asymmetrical pulse stretcher, a condenser lens and the like. This relative movement can allow imaging of the entire object or selected regions of the object.

This repetition is illustrated by stage 550 of introducing a relative movement between the object and an optical component. Stage 550 is preceded by stage 540 and is followed by stage 510 and 560. Stage 560 includes detecting defects, performing measurements or both based upon images acquired by the repetition of stages 510-550.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

In addition, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device.

However, other modifications, variations, and alternatives are also possible. The specifications and drawings are, accordingly, to be regarded in an illustrative rather than in a restrictive sense.

In the claims, the word 'comprising' does not exclude the presence of other elements or steps from those listed in a claim. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite objects "a" or "an" limits any particular claim containing such introduced claim element to inventions containing only one such element, even when the same claim includes the introductory phrases "one or more" or "at least one" and indefinite objects such as "a" or "an." The same holds true for the use of definite objects. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A method for coherence reduction, the method comprising:
receiving, by an asymmetrical pulse stretcher, a first light pulse; wherein the asymmetrical pulse stretcher comprises multiple reflective components which define corners of an optical path forming a loop; wherein at least two reflective components of the multiple reflective components are positioned in a symmetrical manner in relation to each other with regard to at least one of orientation relative to the optical path or position relative to the optical path, and at least two reflective components of the multiple reflective components are positioned in an asymmetrical manner in relation to each other with regard to at least one of orientation relative to the optical path or position relative to the optical path;
generating a sequence of multiple pulses, by the pulse stretcher, during a pulse sequence generation period and in response to the first light pulse;
wherein the multiple reflective components introduce a coherence-related difference between at least two pulses of the multiple pulses;
wherein the pulse sequence generation period does not exceed a response period of a detector;
illuminating an area of an object by the multiple pulses; and
detecting light from the area by the detector.

2. The method according to claim 1, comprising directing the multiple pulses towards substantially the same area of the object.

3. The method according to claim 1, wherein the coherence-related difference is a difference between an incidence angle of the at least two pulses.

4. The method according to claim 1, wherein the coherence-related difference is a difference between a location of incidence of the at least two pulses.

5. The method according to claim 1, comprising introducing an angle of incidence difference between two pulses of the multiple pulses and introducing a location of incidence difference between two pulse of the multiple pulses.

6. The method according to claim 1, comprising directing the multiple pulses towards a second speckle reduction component; wherein the second speckle reduction component reduces a coherency of the multiple pulses.

7. The method according to claim 1, comprising outputting, by the asymmetrical pulse stretcher, the multiple pulses from an output that is positioned at a pupil plane of a condenser lens that directs the pulses towards the object.

8. The method according to claim 1, comprising receiving the first light pulse from a laser, wherein a duration of the first light pulse does not exceed few nanoseconds.

9. The method according to claim 1, wherein the multiple reflective components comprise multiple mirrors.

10. The method according to claim 1, wherein the multiple reflective components comprise multiple mirrors and wherein at least one mirror is located at a height that differs from height of all other mirrors.

11. An optical system having coherence reduction capabilities, comprising:
a light source for generating a first light pulse;
an asymmetrical pulse stretcher arranged to receive the first light pulse and to generate multiple light pulses, during a pulse sequence generation period, wherein the asymmetrical pulse stretcher comprises multiple reflective components which define corners of an optical path forming a loop; wherein at least two reflective components of the multiple reflective components are positioned in a symmetrical manner in relation to each other with regard to at least one of orientation relative to the optical path or position relative to the optical path, and at least two reflective components of the multiple reflective components are positioned in an asymmetrical manner in relation to each other with regard to at least one of orientation relative to the optical path or position relative to the optical path; wherein the multiple reflective components introduce a coherence-related difference between at least two pulses of the multiple pulses; wherein the pulse sequence generation period does not exceed a response period of a detector; and
a condenser lens located between the asymmetrical pulse stretcher and an object for directing the multiple pulses toward an area on the object.

12. The optical system according to claim 11, wherein the condenser lens is arranged to direct the multiple pulses towards substantially the same area of the object.

13. The optical system according to claim 11, wherein the coherence-related difference is a difference between an incidence angle of the at least two pulses.

14. The optical system according to claim 11, wherein the coherence-related difference is a difference between a location of incidence of the at least two pulses.

15. The optical system according to claim 11, wherein the asymmetrical pulse stretcher is arranged to introduce an angle of incidence difference between two pulses of the multiple pulses and introducing a location of incidence difference between two pulse of the multiple pulses.

16. The optical system according to claim 11, wherein the asymmetrical pulse stretcher is arranged to direct the multiple pulses towards a second speckle reduction component; wherein the second speckle reduction component reduces a coherency of the multiple pulses.

17. The optical system according to claim 11, wherein the asymmetrical pulse stretcher is arranged to output the multiple pulses from an output that is positioned at a pupil plane of a condenser lens that directs the pulses towards the object.

18. The optical system according to claim 11, wherein the light source is a laser, wherein a duration of the first light pulse does not exceed few nanoseconds.

19. The optical system according to claim 11, wherein the multiple reflective components comprise multiple mirrors.

20. The optical system according to claim 11, wherein the multiple reflective components comprise multiple mirrors wherein at least one mirror is located at a height that differs from height of all other mirrors.

* * * * *